US012575060B2

(12) United States Patent (10) Patent No.: US 12,575,060 B2
Song et al. (45) Date of Patent: Mar. 10, 2026

(54) COOLING SYSTEM, CABINET, AND DATA CENTER

(71) Applicant: Huawei Digital Power Technologies Co., Ltd., Shenzhen (CN)

(72) Inventors: Jinliang Song, Xi'an (CN); Wei Chen, Shenzhen (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 89 days.

(21) Appl. No.: 18/748,429

(22) Filed: Jun. 20, 2024

(65) Prior Publication Data

US 2024/0349447 A1 Oct. 17, 2024

Related U.S. Application Data

(63) Continuation of application No. PCT/CN2022/126768, filed on Oct. 21, 2022.

(30) Foreign Application Priority Data

Dec. 21, 2021 (CN) .......................... 202111574595.8

(51) Int. Cl.
*H05K 7/20* (2006.01)
(52) U.S. Cl.
CPC ..... *H05K 7/20263* (2013.01); *H05K 7/20272* (2013.01); *H05K 7/20781* (2013.01)
(58) Field of Classification Search
CPC ............. H05K 7/2063; H05K 7/20272; H05K 7/20781

(Continued)

(56) References Cited

U.S. PATENT DOCUMENTS 2,383,292 A * 8/1945 Dalzell ..................... F28F 3/12
165/68
3,802,158 A * 4/1974 Ohle ....................... B03C 3/014
55/440

(Continued)

FOREIGN PATENT DOCUMENTS

CN 102022788 A 4/2011
CN 103200804 A 7/2013

(Continued)

OTHER PUBLICATIONS

Kim et al., "Analytic Approach for the Evaporative Cooling Performance of Flat Membrane Cells", International Journal of Thermal Sciences, The Authors, Elsevier Masson SAS, Aug. 13, 2021, vol. 171, 107205, 10 pages.

*Primary Examiner* — Claire E Rojohn, III
(74) *Attorney, Agent, or Firm* — Maier & Maier, PLLC

(57) ABSTRACT

A cooling system, a cabinet, and a data center. The cooling system is applied to the cabinet and includes a water-cooled heat exchanger, a film cooler, a circulating pump, and a water refill apparatus. The water-cooled heat exchanger is located at an air inlet of the cabinet and is configured to perform heat exchange and cooling on air at the air inlet. The film cooler is located at an air outlet of the cabinet and is configured to perform heat exchange and cooling on air at the air outlet. The water-cooled heat exchanger is provided with a first water inlet and a first water outlet, the film cooler is provided with a second water inlet and a second water outlet, the first water inlet communicates with the second water outlet, the first water outlet communicates with the second water inlet.

14 Claims, 3 Drawing Sheets

(58) Field of Classification Search
USPC ........................................................ 165/80.4
See application file for complete search history.

(56) References Cited

U.S. PATENT DOCUMENTS

| | | | | | |
|---|---|---|---|---|---|
| 4,419,334 | A | * | 12/1983 | Karger ................... | B01D 53/68 |
| | | | | | 423/481 |
| 4,911,233 | A | * | 3/1990 | Chao ......................... | F28B 3/02 |
| | | | | | 261/153 |
| 6,557,266 | B2 | * | 5/2003 | Griffin .................... | F26B 5/005 |
| | | | | | 62/487 |
| 7,885,070 | B2 | * | 2/2011 | Campbell .......... | H05K 7/20809 |
| | | | | | 361/698 |
| 7,903,407 | B2 | * | 3/2011 | Matsushima ...... | H05K 7/20745 |
| | | | | | 361/695 |
| 8,955,347 | B2 | * | 2/2015 | Campbell .......... | H05K 7/20136 |
| | | | | | 361/679.52 |
| 9,629,286 | B2 | * | 4/2017 | Campbell .......... | H05K 7/20781 |
| 9,677,783 | B2 | * | 6/2017 | Liang ................. | H05K 7/20745 |
| 9,839,163 | B2 | * | 12/2017 | Keisling ........... | H05K 7/20781 |
| 10,111,367 | B2 | * | 10/2018 | Kodama ........... | H05K 7/20818 |
| 10,356,949 | B2 | * | 7/2019 | Pan .................... | H05K 7/20772 |
| 11,737,238 | B1 | * | 8/2023 | Weems ................ | H05K 7/2079 |
| | | | | | 361/679.53 |
| 11,805,626 | B1 | * | 10/2023 | Weems .............. | H05K 7/20827 |
| 11,974,412 | B2 | * | 4/2024 | Benson ................ | H05K 7/2039 |
| 12,004,329 | B1 | * | 6/2024 | Pichai ............... | H05K 7/20818 |
| 12,029,015 | B2 | * | 7/2024 | Shaw ................. | H05K 7/20281 |
| 12,363,865 | B2 | * | 7/2025 | Khalili .............. | H05K 7/20327 |
| 12,408,299 | B2 | * | 9/2025 | Li .......................... | H05K 7/208 |
| 2010/0275618 | A1 | * | 11/2010 | Beitelmal ........... | H05K 7/2079 |
| | | | | | 62/515 |
| 2011/0154842 | A1 | * | 6/2011 | Heydari ............. | H05K 7/20836 |
| | | | | | 165/104.33 |
| 2012/0006038 | A1 | * | 1/2012 | Sharma .............. | H05K 7/20745 |
| | | | | | 62/97 |
| 2015/0233588 | A1 | | 8/2015 | Betts et al. | |
| 2018/0084670 | A1 | * | 3/2018 | Hirai .................. | H05K 7/20272 |
| 2018/0270981 | A1 | * | 9/2018 | Miranda Gavillan | ...................... |
| | | | | | G11B 33/144 |
| 2021/0051819 | A1 | * | 2/2021 | Gao ................... | H05K 7/20818 |
| 2021/0123669 | A1 | * | 4/2021 | Lee .................... | H05K 7/20836 |
| 2021/0123844 | A1 | * | 4/2021 | Hu ........................... | G01N 3/42 |
| 2022/0205729 | A1 | * | 6/2022 | Song .................... | F28D 9/0031 |
| 2022/0400583 | A1 | * | 12/2022 | Song ....................... | F24H 15/35 |
| 2022/0400586 | A1 | * | 12/2022 | Song ................. | H05K 7/20827 |
| 2023/0060278 | A1 | * | 3/2023 | Song .................. | H05K 7/206 |
| 2023/0156975 | A1 | * | 5/2023 | Song ................. | H05K 7/20272 |
| | | | | | 361/699 |
| 2023/0397378 | A1 | * | 12/2023 | Beauchemin ...... | H05K 7/20272 |
| 2024/0064934 | A1 | * | 2/2024 | Long .............. | H05K 7/20272 |
| 2024/0074120 | A1 | * | 2/2024 | Mao .................. | H05K 7/20318 |
| 2024/0098933 | A1 | * | 3/2024 | Weisemann ....... | H05K 7/20745 |
| 2024/0284639 | A1 | * | 8/2024 | Grantham .......... | H05K 7/20772 |
| 2024/0349447 | A1 | * | 10/2024 | Song ................. | H05K 7/20827 |
| 2024/0349464 | A1 | * | 10/2024 | Sun .................... | H05K 7/20327 |
| 2024/0353154 | A1 | * | 10/2024 | Ge ......................... | B01D 53/18 |
| 2025/0237402 | A1 | * | 7/2025 | Namjoshi ............... | F24F 11/63 |
| 2025/0275101 | A1 | * | 8/2025 | Wilson .............. | H05K 7/20836 |

FOREIGN PATENT DOCUMENTS

| | | |
|---|---|---|
| CN | 105005339 A | 10/2015 |
| CN | 105546692 A | 5/2016 |
| CN | 108281402 A | 7/2018 |
| CN | 207753984 U | 8/2018 |
| CN | 110636744 A | 12/2019 |
| CN | 110769646 A | 2/2020 |
| CN | 112954955 A | 6/2021 |
| WO | 2014138851 A1 | 9/2014 |
| WO | 2021230525 A1 | 11/2021 |

* cited by examiner

First direction

1023

First direction

1023

1022

1021

COOLING SYSTEM, CABINET, AND DATA CENTER

CROSS-REFERENCE TO RELATED APPLICATIONS

This application is a continuation of International Application No. PCT/CN2022/126768, filed on Oct. 21, 2022, which claims priority to Chinese Patent Application No. 202111574595.8, filed on Dec. 21, 2021. The disclosures of the aforementioned applications are hereby incorporated by reference in their entireties.

TECHNICAL FIELD

The embodiments relate to the field of cabinet cooling system technologies, a cooling system, a cabinet, and a data center.

BACKGROUND

In the wave of "new infrastructure", data center construction is growing rapidly. As data centers have higher requirements on energy saving, efficient energy saving becomes a key requirement in data center construction. Currently, air-cooled air conditioners and chilled water air conditioners are commonly used in small- and medium-sized data centers for heat dissipation. Large-sized data centers gradually use indirect evaporative cooling systems that use natural cooling sources for heat dissipation. On the one hand, these precision air conditioner systems occupy a large amount of space to arrange machine units. On the other hand, as power consumption requirements of data centers become increasingly strict, traditional air-cooled, chilled water, and indirect evaporative cooling refrigerating systems are approaching limits and cannot meet requirements for lower power consumption efficiency.

SUMMARY

The embodiments provide a cooling system, a cabinet, and a data center, to save arrangement space and further reduce energy consumption.

According to a first aspect, the embodiments provide a cooling system. The cooling system may be applied to a cabinet, the cabinet may include a cabinet body, the cabinet body is provided with an air inlet and an air outlet, the cooling system is located in the cabinet body, and the cooling system includes a water-cooled heat exchanger, a film cooler, a circulating pump, and a water refill apparatus. The water-cooled heat exchanger is located at the air inlet of the cabinet body and is configured to perform heat exchange and cooling on air at the air inlet. The film cooler is located at the air outlet of the cabinet body and is configured to perform heat exchange and cooling on air at the air outlet. The water-cooled heat exchanger is provided with a first water inlet and a first water outlet, the film cooler is provided with a second water inlet and a second water outlet, the first water inlet communicates with the second water outlet, the first water outlet communicates with the second water inlet, and the circulating pump may be disposed between the first water inlet and the second water outlet, or disposed between the first water outlet and the second water inlet, to enable water in a first water cavity and water in a second water cavity to circulate. The water refill apparatus communicates with the film cooler to refill water for the film cooler, or the water refill apparatus communicates with the water-cooled heat exchanger to refill water for the water-cooled heat exchanger.

Compared with a conventional solution, in the foregoing cooling system, when air passes through the water-cooled heat exchanger, heat exchange and cooling may be implemented, and water with a higher temperature in the water-cooled heat exchanger may flow to the film cooler. After the air exchanges heat with a heating element, the temperature rises. When the air passes through the film cooler, water in the film cooler absorbs heat and evaporates continuously. A part of generated water vapor may be used to cool high-temperature water in the film cooler, and the other part passes through a film, enters high-temperature air, and cools the high-temperature air. The cooling system uses the film cooler, the water-cooled heat exchanger, and the cabinet to form an integrated cooling system, and does not need to be separately configured with a precision air conditioner in a data center, thereby saving arrangement space and further reducing energy consumption in the foregoing cooling manner.

In some possible implementation solutions, the water-cooled heat exchanger may be a coil pipe heat exchanger, which can effectively increase a heat exchange area with the air and facilitate water circulation between the water-cooled heat exchanger and the film cooler.

In some possible implementation solutions, a material of the film cooler may be polyvinyl fluoride and has good high temperature resistance and corrosion resistance performance.

In some possible implementation solutions, the film cooler may include a plurality of film pipes, the plurality of film pipes sequentially communicate with each other, and the plurality of film pipes may increase an area of a film, so that more water in the film cooler can be discharged from the film cooler when water evaporates to generate water vapor at a higher temperature.

In some embodiments, a material of an inner wall of the film pipe may be a super hydrophobic material, so that more water vapor can be discharged from the film cooler.

In some possible implementation solutions, the water refill apparatus may include a water refill tank. The water refill tank may be provided with a third water inlet, a third water outlet, and an overfall gap, and the third water outlet communicates with the second water cavity, so that the water refill tank may receive supplementary water through the third water inlet, and supplement the water to the film cooler or the water-cooled heat exchanger through the third water outlet, thereby ensuring that the film cooler and the water-cooled heat exchanger can continuously perform water circulation.

According to a second aspect, the embodiments provide a cabinet. The cabinet includes a cabinet body, the cabinet body may include two oppositely disposed first side panels, the two first side panels are arranged in a first direction, and the cabinet further includes the cooling system in any one of the foregoing implementation solutions. One first side panel is provided with an air inlet, the other first side panel is provided with an air outlet, a water-cooled heat exchanger in the cooling system may be located at the air inlet, and a film cooler may be located at the air outlet. When air enters the cabinet from the air inlet, and heat exchange and cooling are performed on the air after the air passes through the water-cooled heat exchanger, heat inside the cabinet can be taken away after the air is exchanged with a heating element in the cabinet. When high-temperature air is exhausted from the air outlet through the film cooler, water in the film cooler absorbs the heat and evaporates continuously. Some of generated water vapor can be used to cool the high-temperature water in the film cooler, and the other part can enter the high-temperature air through a film to cool the high-temperature air, thereby improving a cooling effect and reducing power consumption.

In some possible implementation solutions, the cabinet body may further include two oppositely disposed second side panels, the two second side panels are arranged in a second direction, the second side panels are located between the two first side panels and are connected to the two first side panels. A size of the water-cooled heat exchanger in the second direction may be equal to a size of the first side panel in the second direction, and a size of the film cooler in the second direction may also be equal to a size of the first side panel in the second direction, so that areas of the water-cooled heat exchanger and the film cooler for cooling air are as large as possible. In this way, a better cooling effect is achieved.

According to a third aspect, the embodiments provide a data center, including the cabinet in any one of the foregoing implementation solutions. An air exhaust channel is disposed in the data center, and the air exhaust channel is provided with an air exhaust vent, to enable the air exhaust channel to communicate with the outside through the air exhaust vent. The cabinet is placed inside the data center, an air outlet of each cabinet communicates with the air exhaust channel, and the data center is further provided with a fresh air inlet, to supplement fresh air inside the data center. In the foregoing data center, the air exhaust channel is disposed to communicate with the air outlet of each cabinet, so that air obtained after cooling the cabinet can be discharged from the air exhaust channel. In this way, the data center can obtain a cooling effect in time. In addition, because the film cooler can continuously infiltrate water vapor during working, humidification can also be performed on the data center while refrigerating is performed.

In some possible implementation solutions, the data center may further include an air exhaust fan. The air exhaust fan is disposed at the air exhaust vent of the air exhaust channel and is configured to exhaust damp and hot air.

In some possible implementation solutions, the fresh air inlet may include a filter and infiltration window disposed on a wall of the data center. After supplemented fresh air passes through the filter and infiltration window, air cleanness can be ensured, thereby ensuring a cooling effect of each cabinet.

DETAILED DESCRIPTION OF EMBODIMENTS

Figure 1:
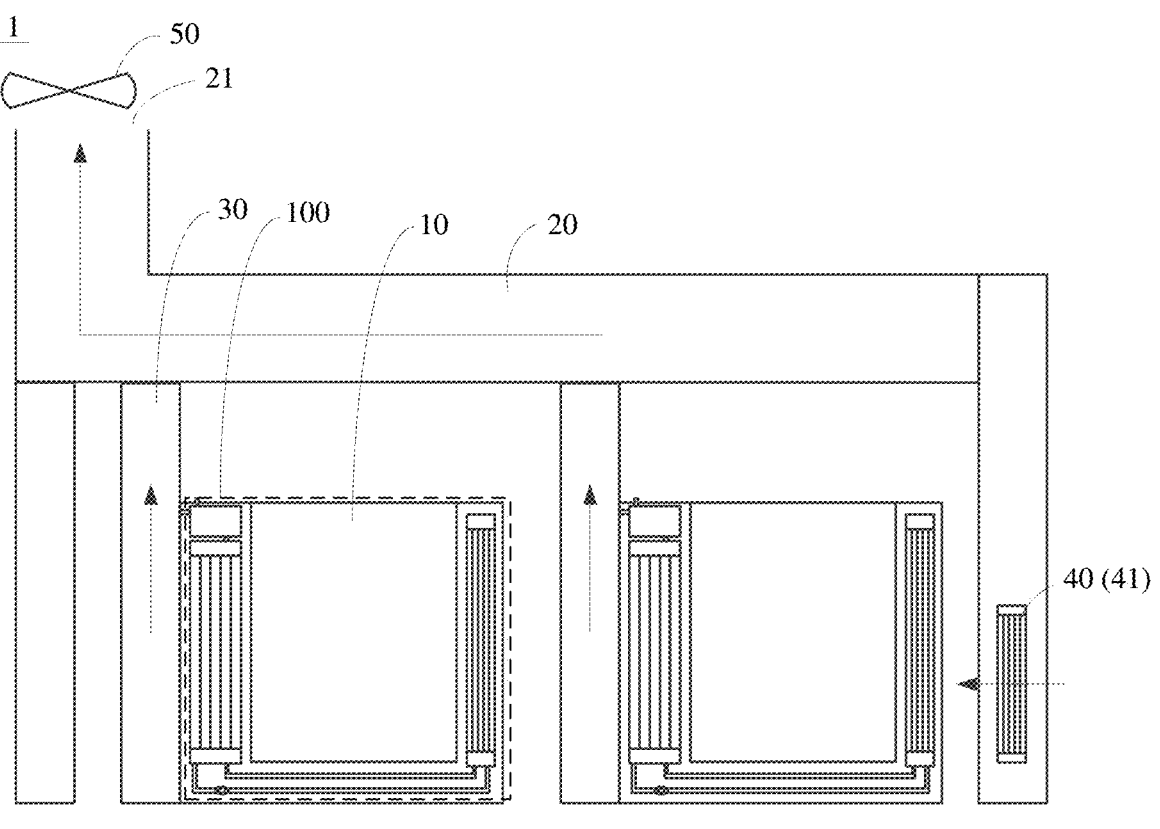
FIG. 1 is a schematic top view of a structure of a data center according to an embodiment.

The following clearly and completely describes the embodiments with reference to the accompanying drawings.

The terms "first", "second", and "third" in embodiments are merely intended for a purpose of description, and shall not be understood as an indication or implication of relative importance. Therefore, a feature limited by "first", "second", or "third" may explicitly or implicitly include one or more features.

The term "and/or" in embodiments describes only an association relationship for describing associated objects and represents that three relationships may exist. For example, A and/or B may represent the following three cases: only A exists, both A and B exist, and only B exists. In addition, the character "/" generally indicates an "or" relationship between the associated objects. The connection may be a direct connection or an indirect connection.

Reference to "an embodiment", "some embodiments", or the like indicates that one or more embodiments include a feature, structure, or characteristic described with reference to the embodiments. Therefore, statements such as "in an embodiment", "in some embodiments", "in some other embodiments", and "in other embodiments" that appear at different places do not necessarily mean reference to a same embodiment. Instead, the statements mean "one or more but not all of embodiments", unless otherwise emphasized in another manner. The terms "include", "contain", "have", and their variants all mean "include but are not limited to", unless otherwise emphasized in another manner.

Currently, cooling systems of small- and medium-sized data centers may use an air-cooled system and a chilled water system. The air-cooled system includes an indoor unit component and an outdoor unit component. The indoor unit component is placed in the data center. A refrigerant exchanges heat in an evaporator of the indoor unit component and takes away the heat generated by the cabinet. A condenser of the outdoor unit component dissipates the heat to the outdoor air. The chilled water system includes a cooling tower, a water-cooled chiller, a water pump, and a chilled water liquid-storage tank at the front end, and a chilled water air conditioner unit at the back end. Prepared low-temperature cold water is sent from the liquid-storage tank to the chilled water air conditioner unit at the back end. After the low-temperature water takes away heat in the data center, the cooling tower and water-cooled chiller cool the water and return the water to the liquid-storage tank. In this way, continuous heat dissipation can be implemented for the data center in a reciprocating cycle. With continuous increase of computing power consumption, power consumption of the data center increases year by year. Currently, a large data center gradually uses an indirect evaporative cooling system that can use a natural cooling source to control a temperature. The indirect evaporative cooling system unit is placed outside the data center. Hot air in the data center enters the indirect evaporative cooling system unit through an air pipe and is sent to the data center after heat exchange between a heat exchanger core and outdoor cold air.

On one hand, the cooling system of the data center needs to occupy a large amount of space for deploying units. On the other hand, as a power consumption requirement of the data center becomes increasingly strict, traditional air-cooled, chilled water, and indirect evaporative cooling refrigerating systems have a large number of power-consuming components such as fans, compressors, and water pumps. Therefore, energy efficiency gradually approaches a limit, and a requirement for lower power consumption cannot be met.

Based on this, an embodiment provides a cooling system. The cooling system may be configured to dissipate heat for a cabinet in a data center. On one hand, the cooling cabinet can be used to save arrangement space in the data center, and on the other hand, energy consumption of the data center can be further reduced. The following describes the cooling system, the cabinet to which the cooling cabinet is applied, and the data center in detail with reference to the accompanying drawings.

Figure 2:
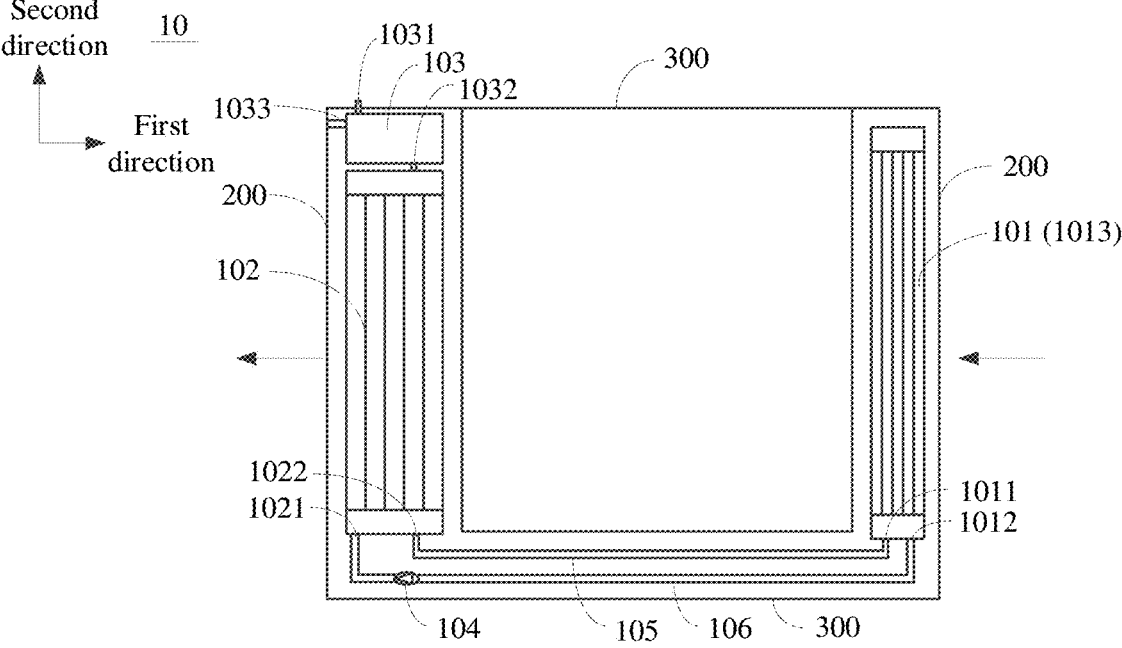
FIG. 2 is a schematic top view of a structure of a cabinet in FIG. 1.

FIG. 1 is a schematic top view of a structure of a data center 1 according to an embodiment, and FIG. 2 is a schematic top view of a structure of a cooling system in FIG. 1. An air exhaust channel 20 and a plurality of independent cabinets 10 are disposed in the data center 1, and one end of the air exhaust channel 20 is provided with an air exhaust vent 21, so that the air exhaust channel 20 can communicate with the outside through the air exhaust vent 21. Each cabinet 10 may be provided with an independent cooling system 100. The cooling system 100 of each cabinet 10 is configured to refrigerate a corresponding cabinet 10. The cabinet 10 may include a cabinet body, the cabinet body has an air inlet and an air outlet, and the air outlet may communicate with the air exhaust channel 20, so that air obtained after the cabinet 10 is refrigerated can be exhausted out through the air exhaust channel 20. For example, an exhaust channel 30 may be disposed at the air outlet of the cabinet 10, so that the cabinet 10 may communicate with the air exhaust channel 20 through the exhaust channel 30. That is, damp and hot air discharged from the cabinet 10 may enter the exhaust channel 30 from the air outlet, enter the air exhaust channel 20 through the exhaust channel 30, and be discharged from the outside through the exhaust channel 30.

An arrow in the figure may be understood as a flow direction of air. The data center may be further provided with a fresh air inlet 40, and fresh air supplemented inside the data center may enter the data center through the fresh air inlet 40. The fresh air enters the cabinet 10 through the air inlet of the cabinet 10, and heat exchange and cooling are performed inside the cabinet 10 by using the cooling system 100. The warmed air enters the exhaust channel 30 through the air outlet of the cabinet 10, and is exhausted to the outside by using the air exhaust channel 20. This cycle repeats, so as to achieve an effect of refrigerating the data center 1.

In some embodiments, the fresh air inlet 40 may be provided with a filter and infiltration window 41. The filter and infiltration window 41 may be installed on a wall of the data center and is configured to filter fresh air to remove impurities in the air, so that in a process of refrigerating each cabinet 10 after the fresh air enters the data center 1, air cleanness is maintained. Therefore, that working elements inside the cabinet 10 are not polluted by the impurities in the air is ensured, to ensure normal running of the cabinet 10.

A quantity of the filter and infiltration windows 41 is not limited. For example, there may be one, two, three, or the like. A volume of fresh air entering the data center may be controlled by setting different quantities of the filter and infiltration windows 41, or a volume of fresh air may be controlled by controlling an area of the filter and infiltration window 41.

In some embodiments, an air exhaust fan 50 may be further disposed at the air exhaust vent 21 of the air exhaust channel 20, to increase an air exhaust rate of the air exhaust channel and help improve a heat dissipation effect of the cabinet.

An arrow in the figure may be understood as a flow direction of air. The cabinet 10 may be approximately in a shape of a hexahedron and includes two oppositely disposed first side panels 200 and two oppositely disposed second side panels 300. The two first side panels 200 may be arranged in a first direction, the two second side panels 300 may be arranged in a second direction, the second side panels 300 are connected between the two first side panels 200, and the first side panels 200 and the second side panels 300 may be perpendicular to each other. The air inlet and the air outlet of the cabinet may be respectively disposed on the two first side panels 200, so that air can enter the cabinet 10 from the air inlet and exhaust the cabinet 10 from the air outlet. The cooling system 100 may include a water-cooled heat exchanger 101, a film cooler 102, a circulating pump 104, and a water refill apparatus (referring to a number 103 in FIG. 2). The water-cooled heat exchanger 101 may be disposed at the air inlet, the water-cooled heat exchanger 101 may include a first water cavity, the first water cavity is filled with cooling water, and the first water cavity may be provided with a first water inlet 1011 and a first water outlet 1012. The film cooler 102 is located at the air outlet, the film cooler 102 may include a second water cavity, the second water cavity is also filled with cooling water, a side wall of the second water cavity is a film, and the film may be used to exhaust water vapor generated during evaporation of temperature rising. The second water cavity may be provided with a second water inlet 1021 and a second water outlet 1022. The first water inlet 1011 of the first water cavity and the second water outlet 1022 of the second water cavity may communicate with each other through a first water pipe 105. The first water outlet 1012 of the first water cavity and the second water inlet 1021 of the second water cavity may communicate with each other through a second water pipe 106. The first water pipe 105 and the second water pipe 106 may be disposed on a same side of the cabinet 10. The circulating pump 104 may be configured to enable water circulation in the first water cavity and the second water cavity, that is, water in the first water cavity enters the second water cavity from the first water outlet 1012 through the second water inlet 1021, or water in the second water cavity enters the first water cavity from the second water outlet 1022 through the first water inlet 1011. It should be noted that the circulating pump 104 may be installed on the first water pipe 105 or may be installed on the second water pipe 106. An installation position of the circulating pump 104 may be designed according to an actual requirement and is not limited herein.

The water-cooled heat exchanger 101 may be a coil pipe heat exchanger 1013. Cooling water may flow continuously in the coil pipe heat exchanger 1013, and flows from the first water inlet 1011 to the first water outlet 1012. During working, after entering the first water cavity from the first water inlet 1011, the cooling water flows to the first water outlet 1012 after heat exchange with air and enters the film cooler 102 through the first water outlet 1012, and the water in the film cooler 102 flows back to the coil pipe heat exchanger 1013 after being cooled by evaporation and heat absorption by water vapor. A structure of the coil pipe heat exchanger 1013 may enable water in the first water cavity to maintain a relatively low temperature after heat exchange is performed on air, so that heat exchange can be continuously performed on air at the air inlet vent to cool down, thereby improving a cooling effect, and reducing energy consumption by using a water circulation working mode.

To improve an effect of heat exchange on air, a size of the coil pipe heat exchanger 1013 in the second direction may be the same as a size of the first side panel 200 in the second direction. By using the structure, a heat exchange area between the coil pipe heat exchanger 1013 and air may be increased, and the coil pipe heat exchanger 1013 can perform heat exchange on air to a greater extent, so that an air temperature after heat exchange and cooling can be further reduced. For example, a size of the coil pipe heat exchanger 1013 in the first direction may be 300 mm to 600 mm.

Figures 3, 4:
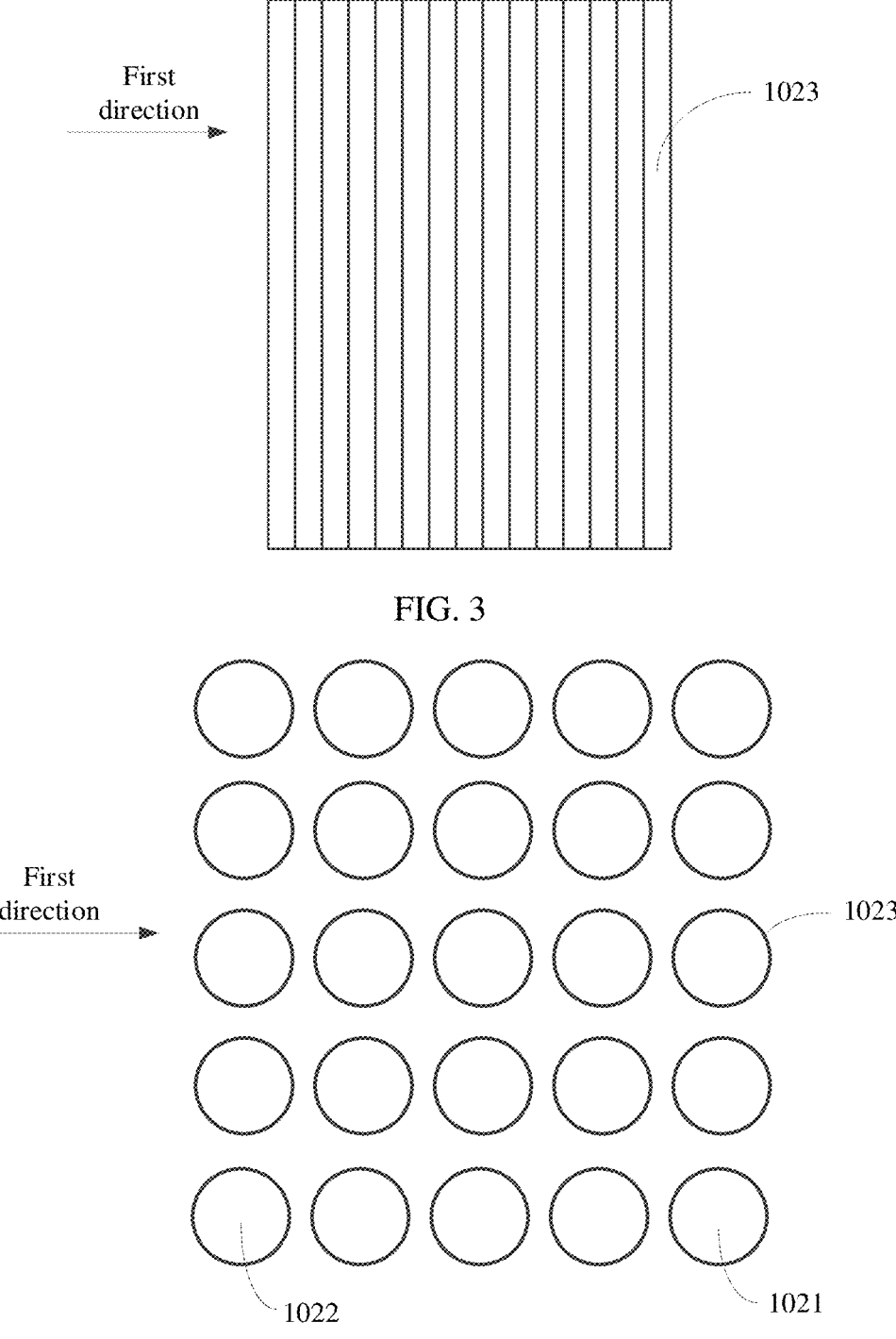
FIG. 3 is a schematic diagram of a structure of a section of a film cooler in FIG. 2.
FIG. 4 is a schematic diagram of a structure of another section of a film cooler in FIG. 2.

FIG. 3 is a schematic diagram of a structure of a cross section of the film cooler 102 in FIG. 2 perpendicular to the first direction, and FIG. 4 is a schematic diagram of a structure of a cross section of the film cooler 102 in FIG. 2 perpendicular to the second direction. The film cooler 102 may include a plurality of film pipes 1023, and the plurality of film pipes 1023 may sequentially communicate with each other to form the second water cavity. During implementation, the plurality of film pipes 1023 may be arranged in an array, the film pipe 1023 may extend in the second direction. During implementation, the second water outlet 1022 may be disposed on the film pipe 1023 at the lower left corner, and the second water inlet 1021 may be disposed on the film pipe 1023 at the lower right corner. After entering the film pipe 1023 from the second water inlet 1021, cooling water passes through the adjacent film pipe 1023 in sequence through an S-shaped flow route, and flows out from the second water outlet 1022.

When air enters the cabinet 10 from the air inlet, the water-cooled heat exchanger 101 located at the air inlet may perform heat exchange and cooling on the air, so that a temperature of the air entering the cabinet 10 decreases, and the air after cooling exchanges heat with a heating element inside the cabinet 10 and then goes through temperature rising again. Similarly, water in the water-cooled heat exchanger 101 whose temperature rises after heat exchange with the air enters the film cooler 102. The high-temperature air in the cabinet 10 passes through the film cooler 102 before being discharged from the air outlet. The water in the film cooler 102 continuously evaporates because heat of the high-temperature air is absorbed, and the water in the second water cavity is cooled through water vaporization and evaporation. In addition, water vapor generated through evaporation can enter the high-temperature air discharged from the cabinet 10 through the film and cools the high-temperature air. That is, a part of a refrigerating capacity generated by evaporation and heat absorption of the water in the film cooler 102 is used to cool high-temperature water in the second water cavity, and the other part is used to cool the high-temperature air discharged from the cabinet 10.

In addition, because the water in the film cooler 102 continuously infiltrates water vapor in an evaporation process, the water vapor may be further used to humidify the data center 1. Therefore, a structure form of the film cooler 102 (that is, a plurality of film pipes 1023 arranged in an array) can increase a water volume in the second water cavity, achieve a better cooling effect when heat exchange and cooling are performed on high-temperature air, and can also increase a humidification amount. In some implementations, the circulating pump 104 may be further configured to control a humidification amount. For example, when the humidification amount needs to be increased, power of the circulating pump 104 may be increased to increase a rotational speed of an impeller inside the circulating pump 104, so that cooling water entering the film cooler 102 in a unit time increases. Because a water volume in the film cooler 102 increases, more water vapor can be generated during heat exchange of high-temperature air, thereby increasing the humidification amount. Similarly, when the humidification amount needs to be reduced, the power of the circulating pump 104 may be reduced. Details are not described herein.

In addition, after the water in the film cooler 102 is evaporated and cooled by using the water vapor, the water may further enter the water-cooled heat exchanger 101 (that is, the first water cavity) by using the second water outlet 1022 through the first water inlet 1011, thereby implementing circulation of the cooling water.

A material of the film cooler 102 may be polyvinyl fluoride, and the polyvinyl fluoride has characteristics of corrosion resistance and high temperature resistance, so as to ensure a stable structure of the film pipe 1023 in a use process, thereby ensuring a cooling effect. In addition, the film pipe 1023 may be designed in a form of a light pipe, and a material of an inner wall of the film pipe 1023 is designed as a super-hydrophobic material, so that water vapor can infiltrate more out of the film cooler 102 during evaporation, thereby improving a humidification effect for the data center.

To improve an effect of heat exchange on air, a size of the film cooler 102 in the second direction may be the same as a size of the second side panel 300 in the second direction. By using the structure, an area of heat exchange between the film cooler 102 and air may be increased, and heat exchange and cooling can be performed on high-temperature air to a greater extent, so that an air temperature after heat exchange and cooling can be further reduced. For example, a size of the film cooler 102 in the first direction may be 300 mm to 600 mm.

It should be noted that a distance between the two first side panels 200 of the cabinet 10 may be approximately 1500 mm. On this basis, the coil pipe heat exchanger 1013 is located at the air inlet, the film cooler 102 is located at the air outlet, the heating element is located between the coil pipe heat exchanger 1013 and the film cooler 102, and the sizes of the coil pipe heat exchanger 1013 and the film cooler 102 in the first direction are not limited herein.

Because the water in the film cooler 102 is in a continuous evaporation state, to ensure that there is enough water in the film cooler 102 to cool the high-temperature air, the water refill apparatus may communicate with the film cooler 102, so as to supplement cooling water to the film cooler 102 in real time.

The water refill apparatus may include a water refill tank 103 that is in a one-to-one correspondence with each cabinet 10, so as to perform water refill on the film cooler 102. During implementation, the water refill tank 103 may be provided with a third water inlet 1031 and a third water outlet 1032. The third water outlet 1032 communicates with the film cooler 102, and the third water inlet 1031 may communicate with a water refill pipe in the data center, so as to control water refill. In addition, the water refill tank 103 may be provided with an overfall gap 1033. When there is excessively much cooling water in the water refill tank 103, the cooling water may flow out from the overfall gap 1033, so as to prevent excessive cooling water in the water refill tank 103 from causing excessive water pressure in the film cooler 102 and affecting a cooling effect.

Figure 5:
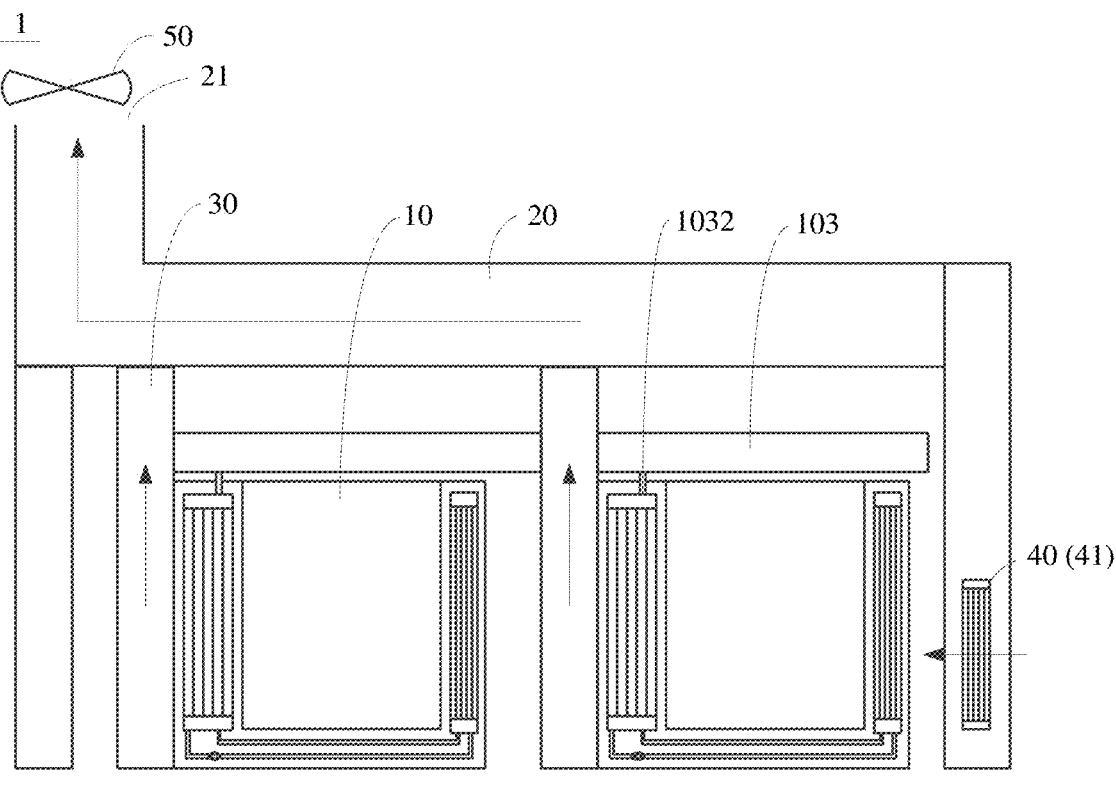
FIG. 5 is another schematic top view of a structure of a data center according to an embodiment.

FIG. 5 is another schematic top view of a structure of the data center according to this embodiment. The water refill apparatus may alternatively include water refill tanks 103 that are correspondingly disposed with the plurality of cabinets 10 in the data center. The water refill tank 103 is provided with a plurality of third water outlets 1032. The plurality of third water outlets 1032 may be disposed in a one-to-one correspondence with the cabinets 10, so that one water refill tank 103 can simultaneously supplement cooling water to a plurality of film coolers 102. The structure of the water refill tank may also be in another form, and examples are not described herein.

It should be noted that, in the foregoing embodiment, only a structure in which the water refill tank 103 communicates with the film cooler 102 is described. In an actual application, the water refill tank 103 may alternatively communicate with the water-cooled heat exchanger 101. Because the circulating pump 104 may enable water circulation between the water-cooled heat exchanger 101 and the film cooler 102, this design manner may also be used to supplement water to the cooling system in time. During implementation, for the structure of the water refill tank 103, reference may be made to the structure in FIG. 2 or FIG. 5, and details are not described herein again.

It should be noted that, for example, power of the cabinet is 10 KW, energy consumption of an existing indirect evaporative cooling system 100 without direct ventilation is 0.156, and energy consumption of an indirect evaporative cooling system 100 with direct ventilation is 0.136. However, in this embodiment, because the water-cooled heat exchanger 101, the film cooler 102, and the cabinet 10 are designed as an integrated structure, no precision air conditioner in the data center needs to be separately configured, thereby effectively reducing energy consumption of the cabinet 10. For example, with reference to FIG. 1 and FIG. 2, when the operating power of the cabinet 10 is 10 KW, when the cooling system 100 without the air exhaust fan 50 is used, energy consumption of each cabinet 10 may be reduced to 0.0254, and when the cooling system 100 with the air exhaust fan 50 is used, energy consumption of each cabinet 10 may be reduced to 0.0735. Compared with the existing cooling system 100, the cooling system 100 in this embodiment effectively reduces energy consumption.

Compared with a conventional cooling system, in the cooling system in this embodiment, the water-cooled heat exchanger, the film cooler, and the cabinet form an integrated system, so that the cooling system has both a cooling mode and a humidification mode, thereby not only improving a cooling effect, but also effectively reducing power consumption of the cabinet.

The foregoing descriptions are merely implementations but are not intended to limit the scope of the embodiments. Any variation or replacement readily figured out by a person skilled in the art shall fall within the scope of the embodiments.

The invention claimed is:

1. A cabinet comprising:
a cabinet body, wherein the cabinet body is provided with an air inlet and an air outlet; and
a cooling system, wherein the cooling system is disposed in the cabinet body and comprises:
a water-cooled heat exchanger, wherein the water-cooled heat exchanger is disposed at the air inlet and includes a first water cavity provided with a first water inlet and a first water outlet;
a film cooler, wherein the film cooler is disposed at the air outlet and includes a second water cavity provided with a second water inlet and a second water outlet, the second water inlet communicates with the first water outlet, and the second water outlet communicates with the first water inlet;
a circulating pump, wherein
the circulating pump is configured to perform water circulation between the first water cavity and the second water cavity and a water refill apparatus is configured to refill water for the film cooler or the water-cooled heat exchanger.

2. The cabinet according to claim 1, wherein a material of the film cooler is polyvinyl fluoride.

3. The cabinet according to claim 1, wherein the film cooler comprises a plurality of film pipes and the plurality of film pipes sequentially communicate with each other.

4. The cabinet according to claim 3, wherein a material of an inner wall of each film pipe of the plurality of film pipes is a super hydrophobic material.

5. The cabinet according to claim 1, wherein the water refill apparatus comprises a water refill tank, the water refill tank is provided with a third water inlet, a third water outlet, and an overfall gap, and the third water outlet communicates with the film cooler or the water-cooled heat exchanger.

6. The cabinet according to claim 1, wherein the water-cooled heat exchanger is a coil pipe heat exchanger.

7. The cabinet according to claim 6, wherein the cabinet body further comprises:
two opposite first side panels, wherein the two first side panels are arranged in a first direction, one of the first side panels is provided with an air inlet, the other first side panel is provided with an air outlet, the water-cooled heat exchanger of the cooling system is located at the air inlet, and the film cooler of the cooling system is located at the air outlet.

8. The cabinet according to claim 7, wherein the cabinet body further comprises:
two opposite second side panels, the two second side panels are arranged in a second direction, and the second side panels are connected between the two first side panels; and
a size of the water-cooled heat exchanger in the second direction is equal to a size of the first side panel in the second direction, and/or a size of the film cooler in the second direction is equal to a size of the first side panel in the second direction.

9. A data center, comprising a plurality of cabinets, wherein an air exhaust channel is disposed in the data center and provided with an air exhaust vent, an air outlet of the cabinet is configured to communicate with the air exhaust channel, the data center is further provided with a fresh air inlet that is configured to supplement fresh air inside the data center; and each cabinet comprises:
a cabinet body, wherein the cabinet body is provided with an air inlet and an air outlet; and
a cooling system, wherein the cooling system is disposed in the cabinet body and comprises:
a water-cooled heat exchanger, wherein the water-cooled heat exchanger is disposed at the air inlet and includes a first water cavity provided with a first water inlet and a first water outlet;
a film cooler, wherein the film cooler is disposed at the air outlet and includes a second water cavity provided with a second water inlet and a second water outlet, the second water inlet communicates with the first water outlet, and the second water outlet communicates with the first water inlet;
a circulating pump, wherein the circulating pump is configured to perform water circulation between the first water cavity and the second water cavity and a water refill apparatus is configured to refill water for the film cooler or the water-cooled heat exchanger.

10. The data center according to claim 9, further comprising:
an air exhaust fan disposed at the air exhaust vent.

11. The data center according to claim 9, wherein the fresh air inlet is provided with a filter and infiltration window and the filter and infiltration window is disposed on a wall of the data center.

12. The cabinet according to claim 6, wherein a size of the coil pipe heat exchanger is between 300 mm and 600 mm.

13. The cabinet according to claim 7, wherein a size of the film cooler in the first direction is between 300 mm and 600 mm.

14. The cabinet according to claim 7, wherein a distance between the two first side panels is approximately 1500 mm.

* * * * *